United States Patent [19]
Atal et al.

[11] 4,133,976
[45] Jan. 9, 1979

[54] PREDICTIVE SPEECH SIGNAL CODING WITH REDUCED NOISE EFFECTS

[75] Inventors: Bishnu S. Atal, Murray Hill, N.J.; Manfred R. Schroeder, Gottingen, Fed. Rep. of Germany

[73] Assignee: Bell Telephone Laboratories, Incorporated, Murray Hill, N.J.

[21] Appl. No.: 894,329

[22] Filed: Apr. 7, 1978

[51] Int. Cl.² .............................................. G10L 1/00
[52] U.S. Cl. .................................... 179/1 P; 179/1 SA
[58] Field of Search ............................. 179/1 P, 1 SA

[56] References Cited

U.S. PATENT DOCUMENTS

| 2,927,962 | 3/1960 | Cutler | 178/43.5 |
| 3,502,986 | 3/1970 | Lucky | 325/38 |
| 3,631,520 | 12/1971 | Atal | 179/1 SA |
| 3,740,476 | 6/1973 | Atal | 179/1 SA |

OTHER PUBLICATIONS

E. Kimme et al., "Synthesis of Optimal Filters for a Feedback Quantization System," IEEE Trans. Circuits, Sep., 1963.
H. Spang et al., "Reduction of Quantizing Noise by Feedback," IEEE Trans. Comm., Dec., 1962.

Primary Examiner—Kathleen H. Claffy
Assistant Examiner—E. S. Kemeny
Attorney, Agent, or Firm—J. S. Cubert

[57] ABSTRACT

A predictive speech signal processor features an adaptive filter in a feedback network around the quantizer. The adaptive filter essentially combines the quantizing error signal, the formant related prediction parameter signals and the difference signal to concentrate the quantizing error noise in spectral peaks corresponding to the time-varying formant portions of the speech spectrum so that the quantizing noise is masked by the speech signal formants.

14 Claims, 10 Drawing Figures

PREDICTIVE SPEECH SIGNAL CODING WITH REDUCED NOISE EFFECTS

TECHNICAL FIELD

This invention relates to digital communication of speech signals and, more particularly, to predictive speech signal processing arangements adapted to reduce noise effects.

BACKGROUND ART

Coding of signals for transmission over digital channels in telephone or other communication systems generally requires sampling an input signal, quantizing the samples, and generating a digital code for each quantized sample. Speech signals are highly coreslated and therefore include a part which can be predicted from its past values. If a digital encoding transmitter and a decoding receiver both comprise apparatus for forming the predicted portion of the highly correlated speech signal, only the unpredicted part of the speech signal need be encoded and transmitted. Consequently, predictive coding of speech signal results in efficient utilization of digital channels without signal degradation.

Predictive speech signal coding as disclosed in U.S. Pat. Nos. 3,502,986 and 3,631,520 involves generation of predictive parameters from a succession of speech signal samples and the formation of a predicted value for each speech signal smaple from the generated parameters and the preceding speech signal samples. The difference between each sample and its predicted value is quantized, digitally encoded and sent to a receiver wherein the difference signal is decoded and combined with the coresponding predicted value formed in the receiver. In this manner, only the signal part which cannot be predicted from the already coded signal is quantized and transmitted whereby a savings in channel capacity is achieved. The savings is reflected in the reduced bit rate needed for transmitting only the unpredicted portion of the redundant speech signal as opposed to the much higher bit rate for transmitting the directly coded speech signal.

The quantizing of signal samples is generally accomplished by selectively generating a signal corresponding to the level of a set of specified amplitude levels that is nearest the amplitude of the signal sample. The error produced by quantization, however, distorts the transmitted signal. As disclosed in U.S. Pat. No. 2,927,962 the noise produced by quantization may be reduced by forming an error signal corresponding to the difference between quantized and unquantized signal samples and modifying the signal samples in a predetermined manner responsive to the error signal. While the total quantizing noise power is unaffected by the mofifying arrangements, the noise power may be concentrated in a specified portion of the signal spectrum where its effects are minimized. A feedback filter arrangement utilizing this principle in television signal coding to place the quantizing noise in the upper frequency range of the signal band is disclosed in the article, "Synthesis of Optimal Filters for a Feedback Quantization System," by E. G. Kimme and F. F. Kuo, IEEE *Transactions on Circuit Theory*, September 1963, pp. 405–413.

The aforementioned quantizing error reduction arrangements which generally concentrate the error power in fixed portions of the frequency spectrum to minimize the RMS error power do not result in optimum noise reduction for speech signal encoding arangements. The lack of optimum noise reduction esults from the nature of the speech signal spectrum which includes a plurality of time varying formant frequency portions corresponding to portions of the short term spectral envelope where speech energy is concentrated, and interformant portions. In voiced regions of speech, the formant portions are directly related to resonances in the vocal tract. The speech signal power is therefore concentrated in said formant portions while interformant regions contain substantially less speech signal power. Consequently, concentrating the quantizing error power in a fixed portion of the frequency spectrum does not take into account the relationship between the quantizing noise spectrum and the changing speech spectrum so that noticeable noise effects remain.

BRIEF SUMMARY OF THE INVENTION

The invention is directed to a speech signal coding arrangement in which formant related predictive parameter signals are generated from an analysis of speech signal over selected intervals. A signal representative of the difference between the speech signal and its predicted value is formed from the present and preceding portion of the speech signal and the generated predictive parameter signals. The difference signal is modified to selectively control noise. The modified difference signal is quantized and a quantizing error signal corresponding to the difference between the quantized and unquantized modified difference signal is produced. The difference signal modification includes combining the quantizing error signal, the formant related predictive parameter signals and the difference signal to concentrate the quantizing error in the formant portions of the speech signal spectrum whereby the transmitted quantizing noise is masked by the speech signal formants.

According to one aspect of the invention, the quantizing error signal is modified responsive to the formant related predictive parameter signals to produce a formant weighted error signal. The formant weighted error signal is combined with the difference signal to concentrate the quantizing error in the formant portions of the speech signal spectrum so that the ratio of speech signal to quantizing noise is maintained above a predetermined level throughout the speech signal spectrum.

According to another aspect of the invention, a set of filter parameter signals are formed from the formant related prediction parameter signals $a_k$ and a formant weighted error signal is produced responsive to said filter parameter signals and said error signal. The formant weighted error signal is subtracted from said difference signal to concentrate the quantizing error in the formant portions of the speech signal spectrum.

According to yet another aspect of the invention, the set of filter parameter signals $f_k$ are formed from the set of formant predictive parameter signals $a_k$ in accordance with the predetermined relationship $$\sum_{k=1}^{p+1} f_k z^{-k} = \frac{1}{2}(1 + z^{-1}) \sum_{k=1}^{p} a_k z^{-k}$$

where $z^{-1}$ represents a delay of one sample interval and p represents the number of predictive parameter signals. The error signal is modified by the prescribed $f_k$ filter parameter signals to form the formant weighted error signal $$w_n = \sum_{k=1}^{p+1} f_k e_{n-k}$$

which is subtracted from the difference signal, where $e_n$ is the present value of the quantizing error signal.

The redundancy due to the formant structure of the speech signal is removed by subtracting the predicted value of the present speech signal derived responsive to the formant related prediction parameter signals from the actual value of the present speech signal. Pitch related redundancy, however, remains in the resulting difference signal as disclosed in U.S. Pat. No. 3,740,476, issued June 19, 1973. According to yet another aspect of the invention, a set of pitch related prediction parameter signals is formed from the analysis of said speech signal for each selected interval. The quantized signal is combined with said pitch related predictive parameter signals to produce a predicted difference signal sample. The predicted difference signal is applied to the difference signal modifying means to reduce the pitch related redundancy of the quantized signal.

DETAILED DESCRIPTION

Figure 1:
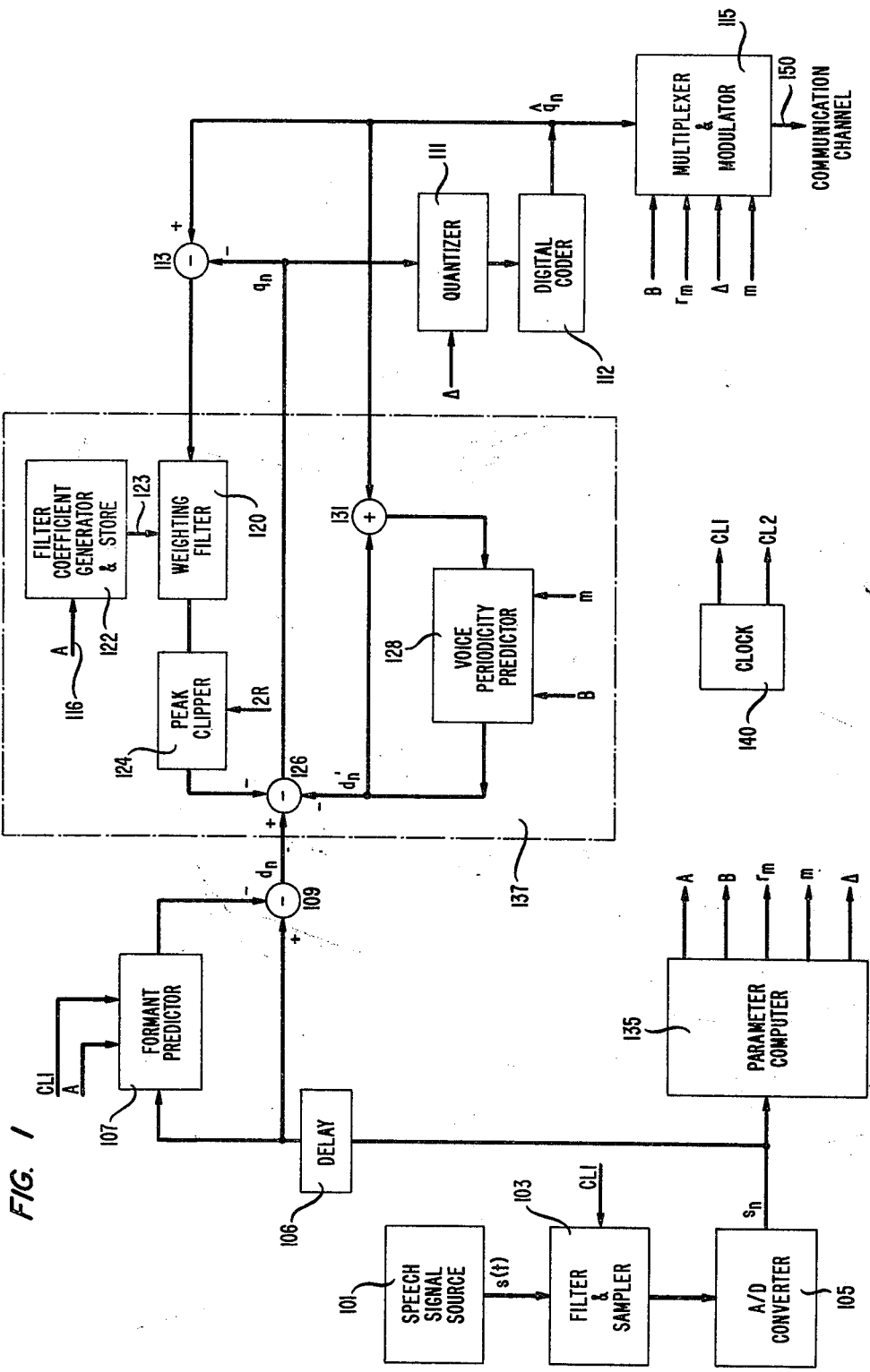
FIG. 1 depicts a block diagram of a predictive speech signal coding circuit illustrative of the invention.

A predictive speech signal encoder illustrative of the invention is shown in FIG. 1. A speech signal s(t) from speech signal source 101 is supplied to filter and sampling circuit 103 in which signal s(t) is lowpass filtered, modified by a high frequency preemphasis arrangement, and sampled at a predetermined rate. Circuit 103 may comprise a lowpass filter with a cutoff frequency of 4 kHz, a preemphasis network with a 6 dB per octave slope beginning at 700 Hz and a sampler having a sampling rate of 8 kHz. The successive signal samples from filter and sampling circuit 103 are applied to analog to digital converter 105 wherein a digital code $s_n$ suitable for use in the encoder is produced for each signal sample.

The successive coded samples $s_n$ from converter 105 are supplied directly to one input of predictive parameter computer 135, and through 80 sample delay 106 to the signal input of formant predictor 107 and to the positive input of subtracter network 109. Delay 106 may comprise a shift register or other delay arrangements well known in the art. Predictor 107 is responsive to the delayed code samples $s_n$ and the prescribed set of predictive signals $A = a_1, a_2, \ldots a_k, \ldots a_p$ obtained from computer 135 to generate a predictive value code $$\sum_{k=1}^{p} s_{n-k} a_k \qquad (1)$$

for each sample, where $a_k$ is the $k^{th}$ linear prediction parameter coefficient and p is the order of the predictor. As is well known in the art, predictor 107 is operative to predict the present value of each signal sample $s_n$ on the basis of the weighted sum of a number of prior sample values in accordance with expression 1. The prediction is based on the short term spectral envelope of the speech signal and the prediction parameter signals $a_1, a_2, \ldots, a_p$ are related to the formant structure of the vocal tract transmission function.

Figure 5:
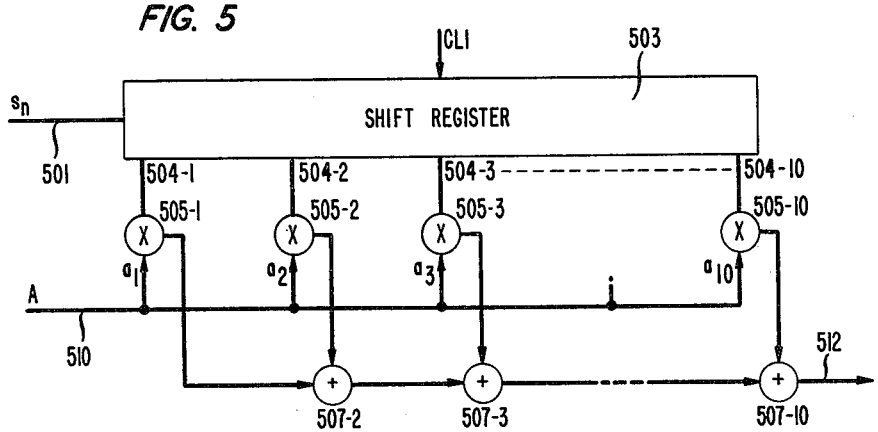
FIG. 5 shows a detailed block diagram of the formant predictors of FIGS. 1 and 2.

FIG. 5 shows a transversal filter well known in the art which may be used as formant predictor 107. The predictor of FIG. 5 may be characterized in z transform notation as $$P_s(z) = \sum_{k=1}^{p} a_k z^{-k} \qquad (2)$$

where $z^{-1}$ represents a delay of one sample interval and $a_1, a_2, \ldots a_k, \ldots a_p$ are the p predictor coefficients. In FIG. 5, p is edqual to 10. Shift register 503 is a 10-stage shift register operated at the CL1 8 kHz sampling rate which receives the successive $s_n$ samples from delay 106 on line 501. The output of the first shift register stage on line 504-1 is supplied to one input of multiplier 505-1. Similarly, the outputs of the remaining shift register stages on lines 504-2 through 504-10 are applied to multipliers 505-2 through 505-10 respectively. Linear prediction coefficient signals $A = a_1, a_2, \ldots, a_{10}$ from computer 135 are applied to multipliers 505-1 through 505-10 via line 510. Each multiplier is operative to form the product $s_{n-k} a_k$ and the products are summed two at a time in adders 507-2 through 507-10 so that a signal representative of the sum of the products in accordance with equation 1 is available on output line 512.

Figure 10:
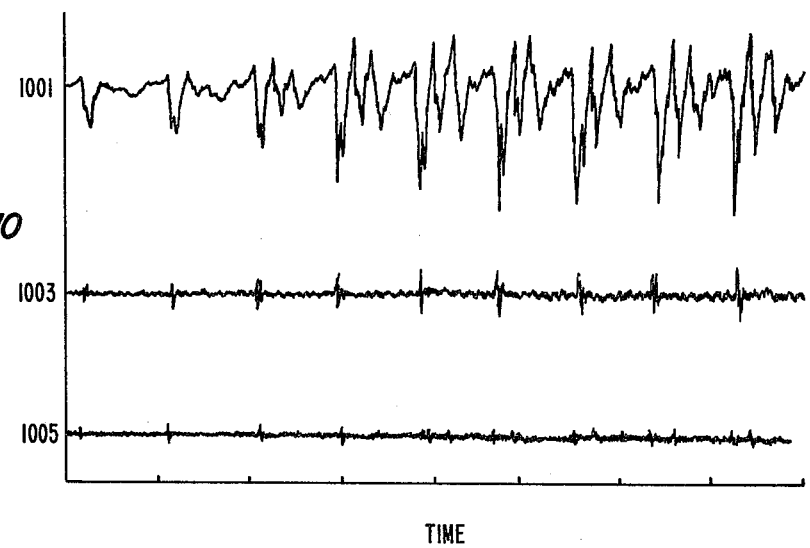
FIG. 10 illustrates signal waveforms obtained in FIG. 1.

The predicted signal from line 512 is applied to the negative input of subtracter network 109 wherein it is subtracted from the present coded sample $s_n$. The resulting difference signal $$d_n = s_n - \sum_{k=1}^{p} s_{n-k} a_k \qquad (3)$$

corresponds to the speech signal with its formant redundancy removed. The removal of the formant redundancy is illustrated in FIG. 10 wherein waveform 1001 shows a portion of a speech signal from source 101 including both formant and pitch period redundancy. Waveform 1003 corresponds to the difference signal of equation 3 wherein the predicted formant component is removed from the speech signal but the pitch period related redundancy remains.

The difference signal $d_n$ from subtracter network 109 is supplied to modifier circuit 137 which includes voice periodicity predictor 128 adapted to remove the pitch pierod redundancy remaining in the difference signal, and weighting filter 120 adapted to redistribute the quantizing noise in the difference signal so as to reduce its perceived effect. The output of modifier circuit 137, $g_n$, is applied to the input of quantizer 111 operative, as is well known in the art, to select one of a set of predetermined amplitude levels responsive to the magnitude of each difference signal sample at its input In quantizer 111, the step size $\Delta$, the difference between quantizer amplitude levels, is determined by the statistical characteristics of the modified difference signal and is generated in prediction parameter computer 135.

The output of quantizer 111, $g_n$, is supplied to subtracter network 113 as well as to adder 131 via digital coder 112. Adder 131 and voice periodicity predictor 128 are adapted to form a predicted value code $d_n'$ for each difference signal sample $d_n$ responsive to a set of prior difference codes, quantizer output signals, and predictor parameter signals $B = b_1, b_2, b_3$ as well as code m representative of the pitch period of the current speech signal segment. Added 131 forms the sum of signal $q_n$ and the predicted difference signal which sum is applied to predictor 128. Predictor 128 generates a predicted value of the present difference signal in accordance with $$d_n' = b_1 d_{n-m+1}^r + b_2 d_{n-m}^r + b_3 d_{n-m-1}^r + g_n \quad (4a)$$

and is characterized in z transform notation by the function $$P_d = b_1 z^{-m+1} + b_2 z^{-m} + b_3 z^{-m-1} \quad (4b)$$

where $z^{-m}$ represents a delay of m samples. $b_1$, $b_2$, and $b_3$ are prediction coefficient signals determined by minimizing the mean squared prediction error between the difference signal $d_n$ and its predicted value.

Signals m and $b_1$, $b_2$ and $b_3$ are generated in computer 135 for each speech signal interval. The predicted value code for the present difference signal is subtracted from the present difference signal $d_n$ in subtracter network 126 so that the pitch period related redundancy is removed from the difference signal. Waveform 1005 in FIG. 10 illustrates the difference signal after pitch period redundancy is removed in subtracter network 126. In contrast to speece waveform 1001 and difference signal waveform 1003, waveform 1005 is noiselike in nature, indicative of the removal of both formant and pitch related redundancy.

Figure 7:
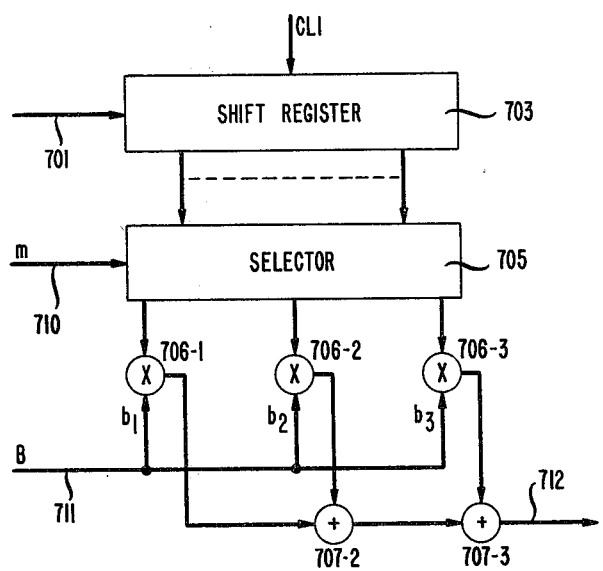
FIG. 7 shows a detailed block diagram of the voice periodicity predictors of FIGS. 1 and 2.

FIG. 7 shows predictor 128 in greater detail. In FIG. 7, shift regisrer 703 comprises 120 stages which stages store the successive samples received from added 131. The 120 stages represent a time period of 15 ms which is the longest anticipated pitch interval. The output of each shift register stage is applied to selector circuit 705 operative to selectively gate three consecutive shift register stage outputs responsive to pitch period related code m from computer 135 in accordance with equations 4a and 4b. The output of the leftmost selected shift register stage is applied to multiplier 706-1. Similarly, the output of the adjacent selected shift register stages are applied to multipliers 706-2 and 706-3, respectively. The predictive parameter signals $b_1$, $b_2$, and $b_3$ are supplied to multipliers 706-1, 706-2, and 706-3 from computer 135 via line 711. The product codes from multipliers 706-1, 706-2, and 706-3 are summed in adders 707-2 and 707-3 whereby the predicted value code for the present difference signal appears on line 712.

Prediction parameter computer 135 generates the predictive parameter signals required for formant predictor 107 and voice periodicity predictor 128 as well as step size and other signals used in the coder. Speech signals, as is well known in the art, are non-stationary. The time varying characteristics of speech, however, change relatively slowly so that it is sufficient to adapt the predictive parameter signals to the changing signal every 10 ms for an 8 kHz sampling rate. Thus, predictor parameter computer 135 receives speech samples $s_n$ during each 10 ms time frame and provides prediction parameter signals for each 10 ms time frame to accommodate changing signal conditions.

Figure 3:
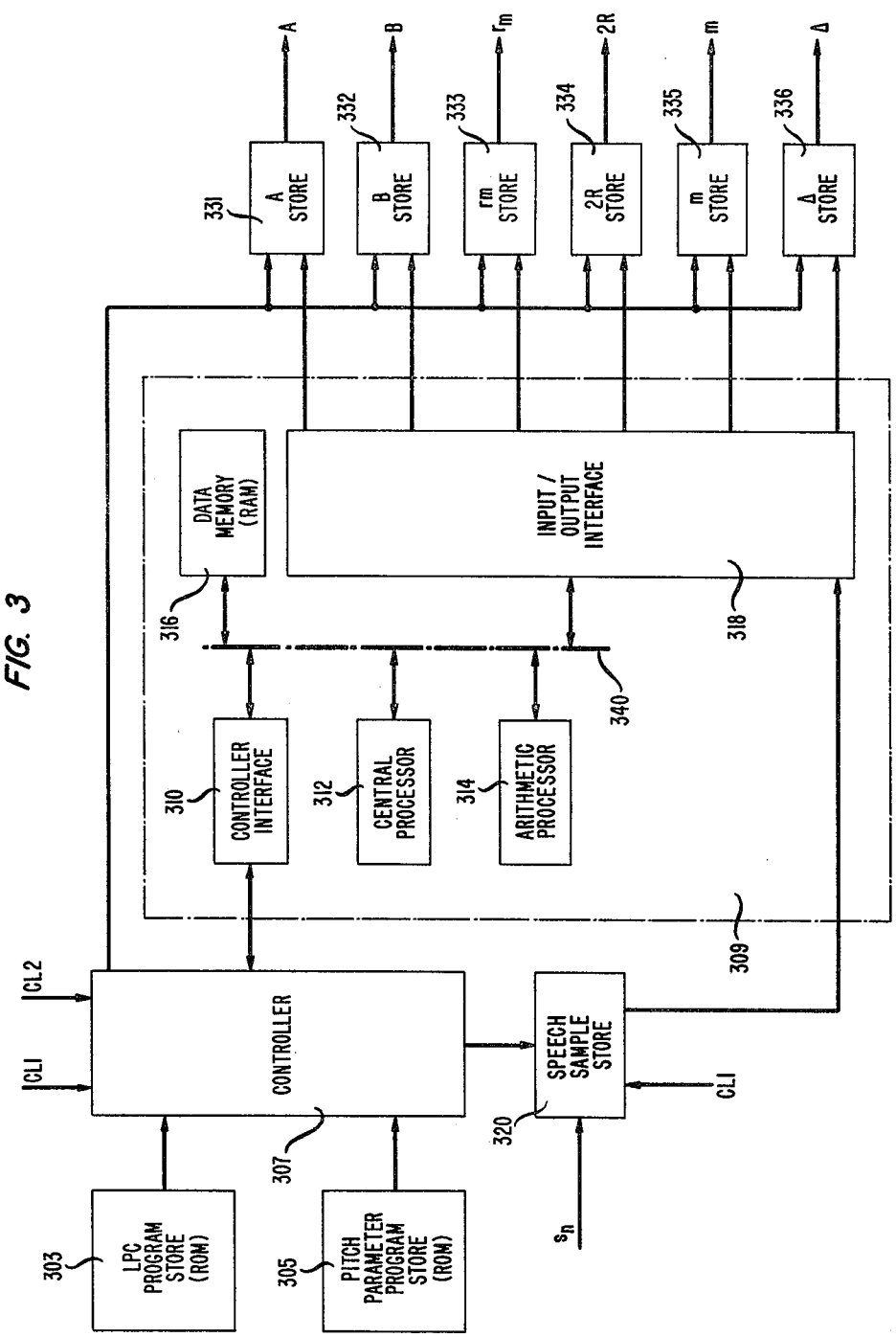
FIG. 3 depicts a block diagram of the prediction computer of FIG. 1.

FIG. 3 shows a processing arrangement suitable for use as computer 135. Referring to FIG. 3, processor 309 is operative to receive stored signal information from sample store 320 and to receive permanently stored program information from read only memories 303 and 305 via controller 307. Responsive to the received signals and the program information, processor 309 generates a set of formant related linear prediction coefficients $A = a_1, a_2, \ldots, a_{10}$, a set of pitch related prediction coefficient signals $B = b_1, b_2, b_3$; a set of formant related partial correlation coefficient signals $r_1, r_2, \ldots, r_{10}$; and RMS value signal 2R, a pitch period related signal m and a step size signal $\Delta$ for use in the other portions of the coder of FIG. 1. The output signals from processor 309 are stored in output stores 331 through 336 as shown in FIG. 3. Processor 309 may be the CSP Inc. Macro Arithmetic Processor system 100 or may comprise other processor arrangements well known in the art.

Figure 8:
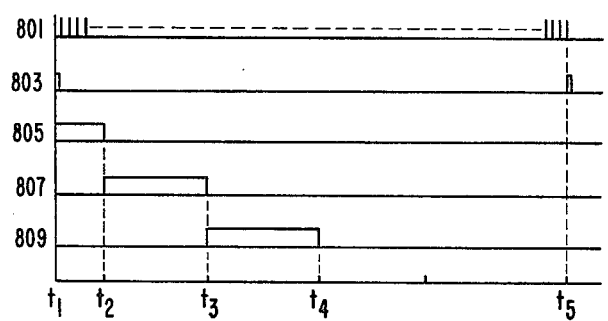
FIG. 8 shows waveforms illustrative of the operation of the prediction computer circuit of FIG. 3.

Controller 307 of FIG. 3 is adapted to partition each 10 ms time frame of the speech signal into a sequence of three predetermined time periods, each dedicated to a particular operating mode. The operating modes are illustrated in FIG. 8. Clockpulses CL2 from clock 140 of FIG. 1 are spaced 10 ms apart and detemine the 10 ms time frames. In FIG. 8, a CL2 clock pulse occurs at time $t_1$, the beginning of a 10 ms time frame. This CL2 clock pulse places controller 307 in its data input mode as illustrated in waveform 805. During the data input mode, controller 307 is connected to processor 309 and to speech sample store 320. Responsive to control signals from controller 307, the 80 $s_n$ sample codes inserted into sample store 320 during the preceding 10 ms time are transferred to data memory 316 via input/output interface 318. As shown in waveform 805, the data input mode is terminated at time $t_2$ when 80 sample codes from store 320 have been applied to predetermined addresses in data memory 318. While the stored 80 samples are transferred to data memory 318, the present frame samples are inserted into store 320 under control of clock pulse CL1.

Just after time $t_2$, controller 307 is placed in its formant prediction parameter mode as shown in waveform 807. During the formant predictiion parameter mode, prediction parameter program memory 303 is connected to central processor 312 via controller 307, controller interface circuit 310, and bus 340. Responsive to the permanently stored instructions from ROM 303, processor 309 is operative to generate formant partial correlation coefficienr signals $r_m = r_1, r_2, \ldots, r_{10}$, and formant linear prediction coefficient signals $A = a_1$ through $a_{10}$. Signals A and $r_m$ are transferred to stores 331 and 333, respectively. The stored instructions for the generation of the formant predictor signals in ROM 303 are listed in Fortran language in Appendix 1.

As is well known in the art, the parameter signals are generated by forming the covariance matrix P whose terms are $$P_{i,j} = \sum_{n=1}^{80} s_{n-i}s_{n-j} \quad i = 1,2,\ldots,10, j = 1,2,\ldots,10 \tag{5}$$

and speech correlation factors $$c_i = \sum_{n=1}^{80} s_n s_{n-i} \quad i = 1,2,\ldots,10 \tag{6}$$

Factors $g_1$ through $g_{10}$ are then computed in accordance with $$T \begin{bmatrix} g_1 \\ g_2 \\ \vdots \\ g_{10} \end{bmatrix} = \begin{bmatrix} c_1 \\ c_2 \\ \vdots \\ c_{10} \end{bmatrix} \tag{7}$$

where T is the lower triangular matrix obtained by the triangular decomposition of $$[P_{ij}] = TT^t \tag{8}$$

The partial correlation coefficients $r_m$ are then generated in accordance with $$r_m = \frac{g_m}{\left[c_0 - \sum_{n=1}^{n} g_i\right]^{\frac{1}{2}}}; \tag{9}$$

where $$c_0 = \sum_{n=1}^{80} s_n^2$$

corresponds to the energy of the speech signal in the 10 ms time frame. Formant linear prediction parameter signals $A = a_1, a_2, \ldots, a_{10}$ are computed from the partial correlation parameter signals $r_m$ in accordance with the recursive formulation $$a_i(m) = a_i(m-1) + r_m a_{m-i}(m-1)$$

$$a_o(o) = 1 \quad i=1,2,\ldots,m-1; m=1,2,\ldots,10 \tag{10}$$

The partial correlation parameter signals $r_m$ and the linear prediction parameter signals $a_i$ generated in processor 309 during the formant prediction parameter mode are transferred from data memory 316 to stores 331 and 333 for use during the next 10 ms time frame. The signals A are also transferred to filter coefficient generator and store 122. During the formant prediction parameter mode, controller 307 is operative to count the CL1 clock pulses from clock 140 to determine the termination time of the mode.

At time $t_3$, after the transfer of the partial correlation and linear prediction parameter signals to stores 331 and 333, controller 307 is placed in its pitch prediction parameter mode as illustrated in waveform 809. Between times $t_3$ and $t_4$, controller 307 is operative to connect pitch prediction program memory 305 to central processor 312 via controller interface 310 and bus 340. The instruction codes in ROM 305 listed in Fortran language in Appendix 2, are operative to form the pitch parameter signals $b_1$, $b_2$, and $b_3$, as well as pitch related signal m for use in voice periodicity predictor 128 of FIG. 1. In accordance with the Fortran language listing of Appendix 2, processor 309 is operative during the pitch prediction mode to calculate the correlations between difference signals $d_n$ and $d_{n-1}$ over a prescribed interval as set forth in equation 11

$$\zeta_i = \frac{\sum_{n=1}^{80} d_n d_{n-i}}{\sum_{n=1}^{80} d_n^2 \sum_{n=1}^{80} d_{n-i}^2} \quad i = 41, 42,\ldots, 120 \tag{11}$$

to determine the time index i for which $\zeta_i$ is maximum. The time at which $\zeta_i$ is maximum (m) is transferred from data memory 316 under control of controller 307.

Processor 309 is also operative to compute pitch prediction parameters $b_1$, $b_2$, and $b_3$ on the basis of the minimization of $$\sum_{n=1}^{80} (d_n - b_1 d_{n-m+1} - b_2 d_{n-m} - b_3 d_{n-m-1})^2 \tag{12}$$

Factor 2R for peak clipper 124 is computed in accordance with $$R = \frac{1}{80} \sum_{n=1}^{80} (d_n - b_1 d_{n-m+1} - b_2 d_{n-m} - b_3 d_{n-m-1})^2 \tag{13}$$

Step-size factor $\Delta$ is also computed for use in quantizer 111 in accordance with $$\Delta = 1.224R \tag{14}$$

for a three-level quantizer as disclosed in the article "Quantizing for Minimum Distortion," by Joel Max, appearing in *IRE Transactions on Information Theory*, Vol. IT-6, pp. 7–121, March 1960. 2R and $\Delta$ are transferred to stores 334 and 336, respectively, by time $t_4$. During the 10 ms time frame between times $t_1$ and $t_5$, the outputs of stores 331 through 336 correspond to the signal values $s_n$ obtained in the 10 ms time frame preceding time $t_1$. At time $t_5$, the parameter signals placed in these stores between times $t_1$ and $t_4$ are applied to the outputs thereof responsive to a control signal from controller 307. In the succeeding time frame, the parameter signals computed between time $t_1$ and $t_5$ are operative to control the coder of FIG. 1. Since the sample signals from analog to digital converter 105 are delayed for a period of 10 ms in delay 106, the parameter signals from computer 135 correspond to the sample signals $s_n$ being processed in predictors 107 and 128 and quantizer 111.

The output of digital coder 112 derived from quantizer 111 comprises a succession of digital codes $q_n$ which are representative of the unpredicted component of the speech signal, i.e., the speech signal with formant and pitch related redundancy removed. Since the predetermined amplitude levels employed in quantizer 111 are not equal to the magnitudes of the $q_n$ samples applied to quantizer 111, distortion or quantizing noise corresponding to $$e_n = \hat{g}_n - g_n \tag{15}$$

is also present in signal $g_n$ from digital coder 112. The distortion is then transmitted via communication channel 150 and appears in the reconstructed speech signal s(t) at the output of the decoder circuit of FIG. 2.

The quantizing noise in the transmitted signal may be reduced by efficient prediction. Such reduction, however, does not insure that the perceived distortion in the reconstructed speech signal is small because the distortion is dependent on the spectrum of the quantizing noise in relation to the speech spectrum. The speech signal spectrum is characterized by time varying formant regions, i.e., regions where the speech signal power is concentrated and interformant regions where the signal power is relatively low. A typical spectrum for a portion of a speech signal is illustrated in waveform 901 of FIG. 9. The frequency of quantizing noise $e_n$, however, is generally uniformly distributed as illustrated in waveform 903.

Figure 9:
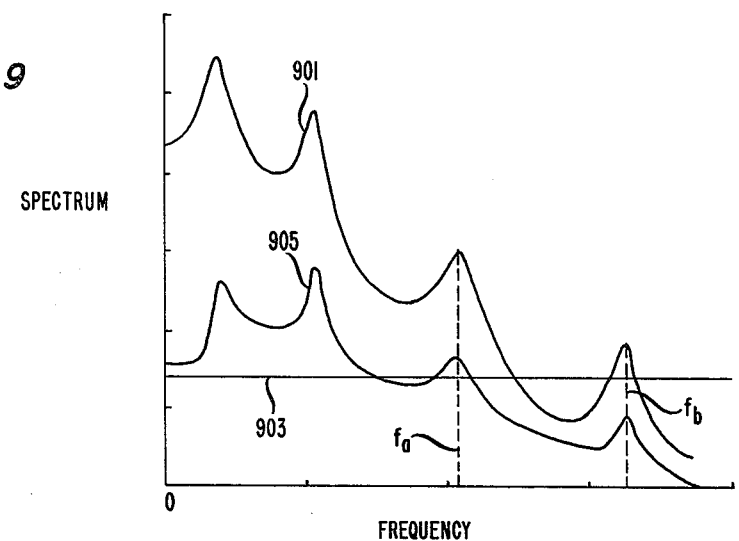
FIG. 9 shows a graph illustrating the quantizing noise reduction features of the coder circuit of FIG. 1.

It is readily observed from waveforms 901 and 903 in FIG. 9 that the quantizing noise of waveform 903 is less than the speech signal power in the formant regions but is prominent in interformant regions where the speech signal level is low. In particular, the quantizing noise in waveform 903 exceeds the speech signal in the interformant region between the formant peaks at frequencies $f_a$ and $f_b$. Further, the speech signal to quantizing noise ratio while relatively high at formants is much lower in the interformant positions of the speech spectrum.

As is well known in the art, the quantizing noise spectrum may be modified by filtering subject to the restriction that the average quantizing noise remains constant. Priorly known filtering arrangements employ characteristics adapted either to shift the quantizing noise to the upper frequency portions of the frequency spectrum or to minimize the RMS value of the noise. Such filtering arrangements, however, are temporally invariant and are therefore ineffective to reduce the perceived noise in a speech signal where the formants shift in time.

In accordance with the invention, an adaptive feedback filter having characteristics controlled by the formant related prediction parameter signals is introduced. The adaptive filter is operative to concentrate the quantizing noise in the formant portions of the speech spectrum in a time varying manner so that the quantizing noise is always masked by the changing speech signal formants. The desired redistributed quantizing noise spectrum is shown in waveform 905. As illustrated in waveform 905, the quantizing noise power is concentrated in the formant portions of the speech signal spectrum of waveform 901 so that the quantizing noise power is reduced in the interformant regions where the perceived noise effect is large. Thus, the speech signal to quantizing error ratio is maintained above an acceptable predetermined value throughout the speech signal spectrum. In this manner, the perceived distortion due to quantizing error noise is reduced.

In FIG. 1, the quantizing noise masking arrangement includes adaptive weighting filter 120 which modifies the quantizing error signal $e_n$ produced in subtracter network 113 in accordance with parameter signals from coefficient generator 122. These parameter signals are produced responsive to the formant prediction parameter signals $A = a_1, a_2, \ldots, a_p$ generated in computer 135. The distortion due to quantization in the circuit of FIG. 1 is the quantizing error $e_n$ of equation 15 modified by the transfer functions of formant predictor 107 and feedback filter 120 as shown in expression 16.

$$E \frac{(1 - F)}{(1 - P_s)}. \tag{16}$$

E represents the short term Fourier transform of the error signal $e_n$; F represents the short term Fourier transform of the transfer function of weighting filter 120, and $P_s$ represents the short term Fourier transform of the transfer function of formant predictor 107. Thus, the quantizing noise power spectrum of the coder output signal may be reshaped in accordance with equation 16. It has been found that the function, in z transform notation, $$\frac{1 - F}{1 - P_s} = \frac{1 + Z^{-1}}{2} + (\frac{1}{1 - P_s})(\frac{1 - Z^{-1}}{2}) \tag{17}$$

provides the quantizing noise filtering required to obtain the noise spectrum distribution of waveform 905.

Equation 17 may be reduced to $$F = \tfrac{1}{2}(1 + z^{-1})P_s \tag{18}$$

Since the transfer function of formant predictor 107 in z transform notation is $$P_s = \sum_{k=1}^{10} a_k z^{-k} \tag{19}$$

the filter transfer function of equation 18 becomes $$F = \sum_{k=1}^{11} f_k z^{-k} = \frac{1}{2} \sum_{k=1}^{10} (a_k z^{-k} + a_k z^{-k-1}) \tag{20}$$

From equation 20, the parameter signals to control weighting filter 120 are $$f_1 = \tfrac{1}{2} a_1$$

$$f_k = \tfrac{1}{2}(a_k + a_{k-1}) \text{ for } k=2,3,\ldots,10 \tag{21}$$

and $f_{11} = \tfrac{1}{2} a_{10}$.

As observed by inspection of equation 21, the weighting filter parameter signals $f_1$ through $f_{11}$ are directly related to the formant prediction parameter signals $a_1$ through $a_{10}$. As the formant prediction parameter signals $a_1$ through $a_{10}$ change responsive to the time varying speech signal, the weighting filter parameter signals $f_1$ through $f_{11}$ are modified so that the quantizing noise spectrum of waveform 905 follows the changing formant characteristics of the speech signal spectrum of waveform 901. In this manner, the quantizing noise spectrum in the $g_n$ signal is always masked by the formant frequency portion of the speech signal and a minimum speech signal to quantizing noise ratio is maintained throughout the speech spectrum.

Figure 4:
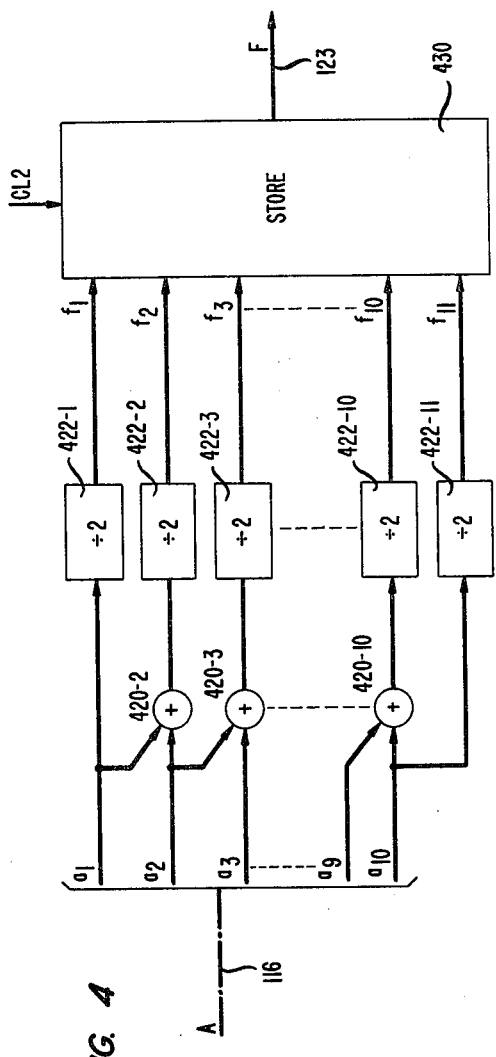
FIG. 4 shows a detailed block diagram of the filter coefficient generator and store circuit of FIG. 1.

Filter coefficient generator and store 122 are shown in detail in FIG. 4. Referring to FIG. 4, parameter signal $a_1$ is applied directly to divide-by-two circuit 422-1 which may comprise a shift register circuit adapted to shift right one place. As is well known in the art, shifting a binary code one place to the right effectively divides the code by a factor of two. The output of divided-by-two circuit 422-1 is filter parameter signal $f_1$. The $a_1$ and $a_2$ parameter signals are summed in adder circuit 420-2 and the resultant is divided by two in circuit 422-2. In like manner, adder 420-3 is operative to sum the $a_2$ and $a_3$ parameters so that the output of divided-by-two circuit 422-3 is filter parameter signal $f_3$. In like manner, filter parameter signals $f_4$ through $f_9$ are generated by similar apparatus not shown in FIG. 4. Filter parameter signal $f_{10}$ is obtained from divided-by-two circuit 422-10 which receives its input from adder 420-10. The $a_{10}$ parameter signal is divided by two in circuit 422-11 to produce the $f_{11}$ filter parameter signal.

The $f_1$ through $f_{11}$ filter parameter signals are generated in accordance with equation 21 in the circuit of FIG. 4 and are transferred to the input section of store 430 during the 10 ms frame prior to the use of these filter parameter signals is weighting filter 120. At the beginning of the next 10 ms frame, responsive to the CL2 clock signal from clock 140, the filter parameter signals in the input section of store 430 are transferred to its output section. In this manner, the filter parameter signals are assigned to each set of 80 samples in filter 120 in the proper 10 ms time frame.

Figure 6:
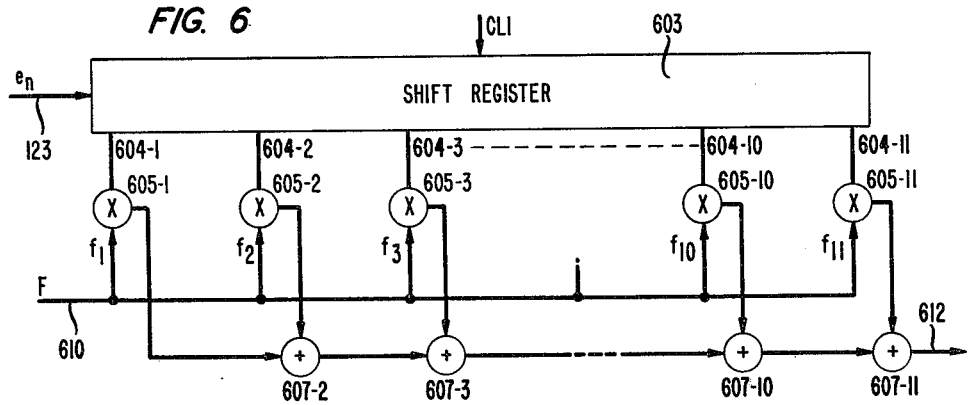
FIG. 6 shows a detailed block diagram of the weighting filter of FIG. 1.

The filter coefficient signals $f_1$ through $f_{11}$ from generator and store circuit 122 are applied to filter 120 via line 123. Weighting filter circuit 120 is shown in detail in FIG. 6. Referring to FIG. 6, the error signal samples $e_n$ from subtracter 113 are sequentially applied via line 123 to 11-stage shift register 603. Signals $e_n$ are sequentially shifted to the right by clock pulses CL1 from clock 140 as is well known in the art. Filter parameter signals $f_1$ through $f_{11}$ are applied via line 610 to multipliers 605-1 through 605-11, respectively. The error signals $e_n, e_{n-1}, \ldots, e_{n-11}$ are applied to multipliers 605-1 through 605-11 from the stages of shift register 603 via lines 604-1 through 604-11, respectively. Multiplier 605-1 is operative to form a prediction code $f_1 e_n$. In like manner, multiplier 605-11 forms the product code $f_{11} e_{n-11}$. The outputs of multiplier 605-1 through 605-11 are successively summed in adders 607-2 through 607-11 whereby the formant weighted error signal $$w_n = \sum_{k=1}^{11} f_k e_{n-k} \quad (22)$$

appears on line 612.

Formant weighted error signal $w_n$ is applied to subtracter 126 via peak clipper circuit 124. In peak clipper circuit 124, coded signal w is compared to RMS value signal 2R from store 337 of computer 135. Where the present value of weighted error signal $$|w| < 2R \quad (23)$$

Signal w is gated directly to subtracter 126. Where, however, $$|w| \geq 2R \quad (24)$$

signal 2R is gated to subtracter 126 if signal w is positive. Signal -2R is gated to subtracter 126 if w is negative. In this manner, the feedback signal provided by error weighting filter 120 to subtracter 126 is limited to twice the RMS value of difference signal $d_n$.

The output of subtracter 126 corresponds to the unpredicted components of the speech signal modified by the feedback filtered quantizing error signal. The resulting output of digital coder 112, $q_n$, is representative of the quantized unpredicted component of the speech signal having a modified quantizing noise spectrum. $Q_n$ is applied to multiplexer and modulator circuit 115, together with pitch parameter signals B and m, partial correlation parameter signals $r_m$ and step-size signal $\Delta$. Circuit 115 is operative to form an appropriately modulated signal which is transmitted via communication channel 150 to the decoder circuit of FIG. 2.

Figure 2:
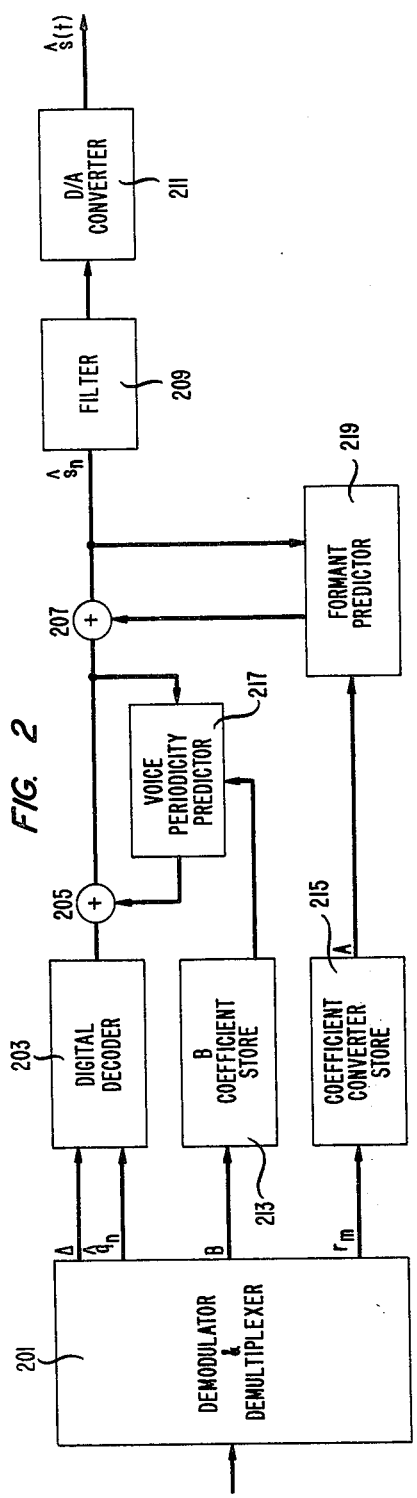
FIG. 2 depicts a block diagram of a predictive speech signal decoding circuit used in conjunction with the circuit of FIG. 1.

The decoder circuit shown in FIG. 2 receives the transmission from communication channel 150 and is operative to form a replica of the speech signal s(t) originally applied from source 101 to the coder circuit of FIG. 1. In FIG. 2, demodulator and demultiplexer circuit 201 is responsive to the transmission from communication channel 150 to provide the quantized unpredicted signal $q_n$ and step-size signal $\Delta$ to digital decoder 203. Decoder 203, as is well known in the art, causes signal $q_n$ to be scaled by step-size signal $\Delta$ and the scaled quantized signal is supplied to one input of adder circuit 205. The other input to adder circuit 205 is obtained from voice periodicity predictor 217.

The pitch related parameter signals $B = b_1, b_2, b_3$ and m from demultiplexer and demodulator 201 for each 10 ms time frame are stored in pitch coefficient store 213 and are applied therefrom to predictor 217. Predictor 217 is identical to predictor 128 of FIG. 1 shown in detail in FIG. 7. Responsive to the sequence of signal codes from adder 205 and prediction parameter signals $b_1, b_2, b_3$ and m from store 213, predictor 217 forms the pitch related predicted component of the speech signal and supplies this component to adder 205. The output of adder 205 represents the excitation signal and comprises the unpredicted and pitch related predicted components of the speech signal. The excitation signal from adder 205 is then applied to one input of adder 207 whose other input is obtained from formant predictor 219. Advantageously, the excitation formation employing voice periodicity predictor 217 does not require detection of voiced and unvoiced segments of the speech signal or the use of a noise source for unvoiced excitation.

The formant related parcor parameter signals $r_m$ of each 10 ms time frame from demultiplexer 201 are transferred to coefficient converter and store 215. Converter 215 is operative to convert the partial correlation parameter signals $r_m$ to the linear prediction parameter signals $A = a_1, a_2, \ldots, a_{10}$. Coefficient converter 215 may comprise a processor such as used in computer 135 in FIG. 1 or other microprocessor arrangements well known in the art. Converter 215 is adapted to form the formant linear prediction parameter signals $a_1, a_2, \ldots, a_{10}$ from the partial correlation parameter signals $r_m$ in accordance with the recursive formulation of equation 10. Signals $r_m$ are transmitted to the receiver of FIG. 2 because improved stability results as is well known in the art.

Formant predictor 219 is identical to predictor 107 of FIG. 1 shown in detail in FIG. 5. Responsive to the sequence of excitation signals from adder 207 and the formant prediction parameter signals $a_1, a_2, \ldots, a_{10}$ from the converter 215, formant predictor 219 is operative to generate the predicted formant component of the speech signal. The output of adder 207 then corresponds to the sequence of replica signal codes $\hat{s}_n$. The output of adder 207 is applied to filter 209 which comprises a deemphasis network complementing the preemphasis network in filter 103 and a lowpass filter corresponding to the filter arrangements of filter 103 in FIG. 1. The sequence of signal samples from filter 209 are converted into an analog replica signal $\hat{S}(t)$ by digital to analog converter 211.

The invention has been described with reference to one illustrative embodiment thereof. It is apparent to one skilled in the art that various modifications may be made without departing from the spirit and scope of the invention. For example, the input of formant predictor of FIG. 1 may be connected to digital coder 112 rather than to delay 106. In this manner, the predicted value of the speech signal is formed from the coded quantized signal $q_n$ instead of the speech signal sample $s_n$.

```
C+++++      GENERATE LPC PARAMETERS
      SUBROUTINE LPCPAR
      COMMON/BLKSIG/S(81),X(90),D(200),V(80),E(91),Y(90)
      COMMON/BLKPAR/R(10),A(10),B(3),M
      COMMON/BLKSCR/P(10,10),T(10,10),C(10),Q(10),W(10)

C+++++      X(1) ........ X(90) ARE SPEECH SAMPLES
C+++++      X(1) ........ X(10) ARE SAMPLES FROM THE PREVIOUS FRAME
C+++++      X(11) ....... X(90) ARE SAMPLES FROM THE CURRENT FRAME

C+++++      COMPUTE ENERGY OF SPEECH SAMPLES
C+++++           ENERGY = PX
      CALL INPROD(X(11),X(11),80,PX)

C+++++      GENERATE SPEECH CORRELATION COEFFICIENTS C(1) .... C(10)
      DO 1 I = 1,10
    1 CALL INPROD(X(11),X(11-I),80,C(I))

C+++++      GENERATE PARTIAL CORRELATIONS AND PREDICTOR COEFFICIENTS
      EE=PX
      DO 100 I = 1,10

C+++++      GENERATE COVARIANCE MATRIX ELEMENTS P(I,J)
      DO 20 J = I,10
      XX = 0.0
      IF (I .EQ. 1 .AND. I .EQ. J) XX = PX
      IF (I .EQ. 1 .AND. J .GT. 1) XX = C(J-1)
      IF (I .GT. 1) XX = P(I-1,J-1)
   20 P(I,J) = XX + X(11-I)*X(11-J) - X(91-I)*X(91-J)

C+++++      CONVERT TO TRIANGULAR MATRIX T WHERE P = T*T (TRANSPOSE)
      DO 40 J = 1,I
      SM = P(J,I)
      K = 1
    3 IF (K .EQ. J) GO TO 4
      SM = SM - T(I,K)*T(J,K)
      K = K + 1
      GO TO 3

4 IF (I .EQ. J) W(J) = 1/SQRT(SM)
      IF (I.NE.J) T(I,J) = SM*W(J)
   40 CONTINUE

C+++++      GENERATE PARTIAL CORRELATION R(I)
      SM = C(I)
      IF (I .EQ. 1) GO TO 5
      DO 50 J = 2,I
   50 SM = SM - T(I,J-1)*Q(J-1)
    5 Q(I) = SM*W(I)
      IF (I .EQ. 1) GO TO 80

EE = EE - Q(I-1)*Q(I-1)
   80 R(I) = -Q(I)/SQRT(EE)

C+++++      GENERATE PREDICTOR COEFFICIENTS A(1) ... A(I)
      A(I) = R(I)
      IF (I .EQ. 1) GO TO 100
      K = 1
    6 IF (K .GT. I/2) GO TO 100
      TI = A(K)
      TJ = A(I-K)
      A(K) = TI + R(I)*TJ
      A(I-K) = TJ + R(I)*TI
      K = K + 1
      GO TO 6

100 CONTINUE

C+++++      GENERATE FIRST DIFFERENCE SIGNAL
      DO 110 N = 11,90

D(N) = X(N)
      L = N - 1

DO 10 I = 1,10
      D(N) = D(N) + A(I)*X(L)
   10 L = L - 1

110 CONTINUE

RETURN
      END
      SUBROUTINE INPROD(X,Y,N,PX)
      DIMENSION Y(N),X(N)
      PX = 0.0
      DO 1 I = 1,N
    1 PX = PX + X(I)*Y(I)
      RETURN
      END
```

```
C+++++      GENERATE PITCH PREDICTOR PARAMETERS
      SUBROUTINE PCHPAR
      COMMON/BLKSIG/S(81),X(90),D(200),V(80),E(91),Y(90)
      COMMON/BLKPAR/R(10),A(10),B(3),M
      COMMON/BLKSCR/P(10,10),T(10,10),C(10),Q(10),W(10)

C+++++      COMPUTE ENERGY OF FIRST DIFFERENCE SIGANL IN THE CURRENT FRAME
C+++++          ENERGY = PD0
      CALL INPROD(D(121),D(121),80,PD0)

C+++++      COMPUTE ENERGY OF PAST FIRST DIFFERENCE SIGNAL
C+++++          ENERGY = PD1
      CALL INPROD(D(81),D(81),80,PD1)

C+++++      DETERMINE LOCATION OF CORRELATION PEAK
      CORMAX = -1.1
      CORP = 1.1
      CORT = 0.0

DO 100 I = 41,120

C+++++      GENERATE CORRELATION AT DELAY I
C+++++          CORRELATION = CORL
      CALL INPROD(D(121),D(121-I),80,P2)
      PD1 = PD1 + (D(121-I) + D(201-I))*(D(121-I) - L(201-I))
      CORL = P2/SQRT(PD1*PD0)

C+++++      SKIP TO 10 IF NOT AT A CORRELATION PEAK
      IF(CORT .LT. CORL .OR. CORT .LT. CORP) GO TO 10

C+++++      FIND CORRECT PEAK BY INTERPOLATION
      CORM = CORT + 0.125*((CORP - CORL)**2)/(2*CORT - CORP -CORL)
      IF(CORM .LT. CORMAX) GO TO 10
      CORMAX = CORM
      M = I-1
   10 CORP=CORT
      CORT = CORL

100 CONTINUE

C+++++      GENERATE B-COEFFICIENTS FOR PITCH PREDICTION
      CALL INPROD(D(121-M),D(121-M),80,PD)
      CALL INPROD(D(121-M),D(122-M),80,PD1)
      CALL INPROD(D(120-M),D(122-M),80,PD2)
      R1 = PD1/PD
      R2 = PD2/PD
      CALL INPROD(D(121),D(122-M),80,C1)
      CALL INPROD(D(121),D(121-M),80,C2)
      CALL INPROD(D(121),D(120-M),80,C3)
      C1 = C1/PD
      C2 = C2/PD
      C3 = C3/PD
      B1 = ((1 - R1)*(C1 + C3) + (1 - 2*R1 + R2)*C2)/(1 - 2*R1**2 + R2)
      B2 = (C1 - C3)/(1 - R2)
      B3 = (C1 + C3 - 2*R1*C2)/(1 - 2*R1**2 + R2)
      B(1) = 0.5*(B2 + B3)
      B(3) = 0.5*(B3 - B2)
      B(2) = B1 - B(1) - B(3)

C+++++      GENERATE PITCH PREDICTED DIFFERENCE SIGNAL
      DO 110 N = 121,200
  110 V(N) = D(N) - B(1)*D(N-M+1) - B(2)*D(N-M) - B(3)*D(N-M-1)

RETURN
      END
      SUBROUTINE INPROD(X,Y,N,PX)
      DIMENSION Y(N),X(N)
      PX = 0.0
      DO 1 I = 1,N
    1 PX = PX + X(I)*Y(I)
      RETURN
      END
      SUBROUTINE INPROD(X,Y,N,PX)
      DIMENSION Y(N),X(N)
      PX = 0.0
      DO 1 I = 1,N
    1 PX = PX + X(I)*Y(I)
      RETURN
      END
```

We claim:

1. A predictive speech signal communication system comprising apparatus (135) for analyzing a speech signal in selected time intervals to generate a set of formant related prediction parameter signals for each interval; circuitry (107,109) jointly responsive to said speech signal and said formant related prediction parameter signals for producing a signal representative of the difference between said speech signal and its predicted value; a modifying circuit (137) for modifying said difference representative signal; a quantizer (111) responsive to said modified difference signal for generating a quantized signal; and a subtracter circuit (113) for forming a quantizing error signal corresponding to the difference between said quantized and unquantized modified difference signal CHARACTERIZED IN THAT said modifying circuit (137) is jointly responsive to said formant related prediction parameter signals, said quantizing error signal and said difference signal to concentrate the quantizing error in the formant portions of said speech signal spectrum whereby the quantizing error is masked by said speech signal formants.

2. A predictive speech signal communication system according to claim 1 further CHARACTERIZED IN THAT said modifying circuit (137) comprises means (120, 122, 124) jointly responsive to said formant related prediction parameter signals and said quantizing error signal for forming a formant weighted error signal, and means (126) for combining said formant weighted error signal with said difference signal to concentrate the quantizing error in the formant portions of the speech signal spectrum to maintain the speech signal to quantizing error ratio above a predetermined level throughout the speech signal spectrum.

3. A predictive speech signal communication system according to claim 2 further CHARACTERIZED IN THAT said formant weighted error signal forming means (120, 122, 124) comprises means (122) responsive to said formant related prediction parameter signals for generating a set of adaptive filter parameter signals, and means (120) jointly responsive to said adaptive filter parameter signals and said quantizing error signal for forming said formant weighted quantizing error signal; and said combining means (126) is adapted to subtract said formant weighted error signal from said difference signal.

4. A predictive speech communication system according to claim 3 further CHARACTERIZED IN THAT said adaptive filter parameter signal generating means (122) is adapted to form a set of filter parameter signals $f_1, f_2, \ldots, f_p, f_{p+1}$ in accordance with the predetermined relationship $$\sum_{k=1}^{p+1} f_k z^{-k} = \frac{1}{2}(1 + z^{-1}) \sum_{k=1}^{p} a_k z^{-k}$$

where $z^{-1}$ represents a delay unit, $a_k$ is the $k^{th}$ formant related prediction parameter signal, and p is the number of predictive parameter signals.

5. A predictive parameter speech communication system according to claim 4 further CHARACTERIZED IN THAT said formant weighted quantizing error signal forming means (120) comprises a transversal filter circuit adapted to form a formant weighted quantizing error signal $$w_n = \sum_{k=1}^{p+1} f_k e_{n-k}$$

where $w_n$ is the present formant weighted quantizing error signal value and $e_n$ is the present quantizing error signal value.

6. A predictive speech signal communication system according to any of claims 2 through 5 further CHARACTERIZED IN THAT said analyzing means (135) is also adapted to generate a set of pitch related prediction parameter signals $b_1$, $b_2$, $b_3$ and a pitch period related signal m and said modifying means (137) further comprises a voice periodicity predictor (128) responsive to said quantized signal, pitch related prediction parameter signals $b_1$, $b_2$ and $b_3$ and said pitch period related signal m for forming a signal $$d'_n = b_1 d'_{n-m+1} + b_2 d'_{n-m} + b_3 d'_{n-m-1} + \hat{q}_n$$

corresponding to the predicted value of said difference signal where $d_n'$ is the present value of said predicted difference signal and $\hat{q}_n$ is the quantized signal, and said combining means (126) is also adapted to subtract the predicted value of said difference signal from said difference signal to reduce pitch related redundancy in said modified difference signal.

7. A predictive speech signal communication system according to claim 6 further comprising means (203, 205, 217) responsive to said quantized signal for producing an excitation signal and means (215, 219, 207) jointly responsive to said excitation signal and said formant related predictive parameter signals for forming a replica of said speech signal CHARACTERIZED IN THAT said excitation signal producing means (213, 217, 205) includes a voice periodicity predictor (217) responsive to said quantized signal, said pitch related prediction parameter signals and said pitch period related signal for forming a signal corresponding to the predicted value of said difference signal and means (205) for combining said predicted value of said difference signal with said quantized signal.

8. A method for processing a speech signal comprising the steps of analyzing said speech signal in selected intervals to generate a set of formant related prediction parameter signals for each interval; producing a signal representative of the difference between the present speech signal and its predicted value responsive to said speech signal and said formant related prediction parameter signals; modifying said difference signal; quantizing said modified difference signal; and forming a quantizing error signal corresponding to the difference between said quantized and unquantized modified difference signals CHARACTERIZED IN THAT the modification of said difference signal includes combining said formant related prediction parameter signals, said quantizing error signal and said difference signal to concentrate the quantizing error in the formant portions of said speech signal spectrum so that the quantizing error is masked by said speech signal formants.

9. A method for processing a speech signal according to claim 8 further CHARACTERIZED IN THAT said difference signal modification includes forming a formant weighted quantizing error signal from said formant related prediction parameter signals and said quantizing error signal, and combining said formant weighted error signal with said difference signal to concentrate the quantizing error in the formant portions of said speech signal spectrum so that the speech signal to quantizing error ratio is maintained above a predetermined level throughout said speech signal spectrum.

10. A method for processing a speech signal according to claim 9 further CHARACTERIZED IN THAT said formant weighted error signal formation includes generating a set of adaptive filter parameter signals responsive to said formant related prediction parameter signals, and weighting said quantizing error signals with said adaptive filter parameter signals; and the combining of said difference signal with said formant weighted error signal includes subtracting said formant weighted error signal from said difference signal.

11. A method for processing a speech signal according to claim 10 further CHARACTERIZED IN THAT the generation of said adaptive filter parameter signals includes forming a set of filter parameter signals $f_1, f_2, \ldots, f_p, f_{p+1}$ in accordance with the relationship $$\sum_{k=1}^{p+1} f_k z^{-k} = \frac{1}{2}(1+z^{-1})\sum_{k=1}^{p} a_k z^{-k}$$

when $z^{-1}$ represents a prescribed delay, $a_k$ is the $k^{th}$ formant related prediction parameter signal, and p is the number of formant related prediction parameter signals.

12. A method for processing a speech signal according to claim 11 further CHARACTERIZED IN THAT the formation of said formant weighted quantizing error signal includes filtering said quantizing error signal in accordance with the relationship $$w_n = \sum_{k=1}^{p+1} f_k e_{n-k}$$

where $w_n$ is the present value of the formant weighted quantizing error signal and $e_n$ is the present value of the quantizing error signal.

13. A method for processing a speech signal according to any of claims 9 through 12 further CHARACTERIZED IN THAT said speech signal analysis includes forming a set of pitch related prediction parameter signals $b_1, b_2, b_3$ and a pitch period related signal m for each interval, said difference signal modification includes producing a signal corresponding to the predicted value of said difference signal in accordance with the relationship $$d'_n = b_1 d'_{n-m+1} + b_2 d'_{n-m} + b_3 d'_{n-m-1} + \hat{q}_n$$

where $d'_n$ is the present value of the predicted difference signal and $\hat{q}_n$ is the quantized signal, and said predicted value of said difference signal is combined with said difference signal and said formant weighted error signal to reduce the pitch related redundancy in said modified difference signal.

14. A method for processing a speech signal according to claim 13 further including the steps of producing an excitation signal responsive to said quantized signal and forming a replica of said speech signal by combining said excitation signal with said formant related prediction parameter signals CHARACTERIZED IN THAT said excitation producing step comprises forming a signal corresponding to the predicted value of said difference signal from the preceding portion of said quantized signal, said pitch related prediction parameter signals $b_1, b_2, b_3$ and said pitch related signal m and combining the present quantized signal with said predicted value of difference signal.

* * * * *

UNITED STATES PATENT AND TRADEMARK OFFICE
CERTIFICATE OF CORRECTION

PATENT NO. : 4,133,976
DATED : January 9, 1979
INVENTOR(S) : Bishnu S. Atal and Manfred R. Schroeder It is certified that error appears in the above-identified patent and that said Letters Patent are hereby corrected as shown below:

Column 1, line 16, "correslated" should read --correlated--; line 29, "smaple" should read --sample--; line 34, "coresponding" should read --corresponding--; line 54, "mofifying" should read --modifying--. Column 2, line 1, "esults" should read --results--. Column 3, line 5, "rom" should read --from--; line 53, "sampld" should read --sampled--; line 62, "the" should read --The--. Column 4, line 29, "edqual" should read --equal--; line 65, "pierod" should read --period--. Column 5, line 1, "$g_n$" should read --$q_n$--; line 4, after "input" insert --a period--; line 9, "$g_n$" should read --$\hat{q}_n$--; line 17, "Added" should read --Adder--; line 18, "$q_n$" should read --$\hat{q}_n$--; line 23, that portion of the formula reading "$g_n$" should read --$\hat{q}_n$--; line 38, "Wavefore" should read --Waveform--; line 41, "speece" should read --speech--; line 46, "regisrer" should read --register--; line 47, "added" should read --adder--. Column 6, line 34, "detemine" should read --determine--; line 42, after "time" insert --frame--; line 51, "pulse" should read --pulses--; line 54, "predictiion" should read --prediction--; line 60, "coefficienr" should read --coefficient--. Column 7, line 30, that portion of the formula reading "n = 1" should read --i = 1--. Column 8, line 1, "$d_{n-1}$" should read --$d_{n-i}$--; line 50, "$q_n$" should read --$\hat{q}_n$--; line 59, that portion of the formula reading "$g_n - g_n$" should read --$\hat{q}_n - q_n$--; line 61, "$g_n$" should read --$\hat{q}_n$--; line 64 "s(t)" should read --$\hat{s}(t)$--. Column 10, line 49, "$g_n$" should read --$\hat{q}_n$--; lines 58 and 59 "divided" should read --divide--; line 63, "divided" should read --divide--; line 67 "divided" should read --divide--. Column 11, line 7, "is" should read --in--; line 55,

UNITED STATES PATENT AND TRADEMARK OFFICE
CERTIFICATE OF CORRECTION

PATENT NO. : 4,133,976

DATED : January 9, 1979

INVENTOR(S) : Bishnu S. Atal and Manfred R. Schroeder

It is certified that error appears in the above-identified patent and that said Letters Patent are hereby corrected as shown below:

"$q_n$" should read --$\hat{q}_n$--; line 57, "$Q_n$" should read --$\hat{q}_n$--. Column 12, line 3, "$q_n$" should read --$\hat{q}_n$--; line 5, "$q_n$" should read --$\hat{q}_n$--; line 58, "$S(t)$" should read --$\hat{s}(t)$--; line 68, "$q_n$" should read --$\hat{q}_n$--.

Signed and Sealed this

Sixth Day of November 1979

[SEAL]

Attest:

RUTH C. MASON
*Attesting Officer*

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,133,976

DATED : January 9, 1979

INVENTOR(S) : Bishnu S. Atal and Manfred R. Schroeder

It is certified that error appears in the above-identified patent and that said Letters Patent are hereby corrected as shown below:

Column 10, line 49, "minimum" should read --maximum--. Column 11, line 19, "123" should read --601--.

In the drawing, FIG. 6, number "123" should read --601--.

Signed and Sealed this

Eighth Day of April 1980

[SEAL]

Attest:

SIDNEY A. DIAMOND

Attesting Officer

Commissioner of Patents and Trademarks